(12) United States Patent
Gärtner

(10) Patent No.: US 6,479,101 B2
(45) Date of Patent: Nov. 12, 2002

(54) METHOD OF COATING A CONCAVE FRICTION BEARING

(75) Inventor: Walter Gärtner, Gmunden (AT)

(73) Assignee: Miba Gleitlager Aktiengesellschaft, Laakirchen (AT)

( * ) Notice: Subject to any disclaimer, the term of this patent is extended or adjusted under 35 U.S.C. 154(b) by 0 days.

(21) Appl. No.: 09/794,511

(22) Filed: Feb. 27, 2001

(65) Prior Publication Data

US 2001/0024687 A1 Sep. 27, 2001

(30) Foreign Application Priority Data

Mar. 9, 2000 (AT) .......................................... 397/2000

(51) Int. Cl.7 ......................... C23C 16/44; C23C 16/458
(52) U.S. Cl. .................... 427/255.5; 427/251; 427/597; 384/445
(58) Field of Search .............................. 427/251, 255.5, 427/585, 597; 384/445; 118/715, 720, 723 EB, 730

(56) References Cited

U.S. PATENT DOCUMENTS

| | | | | |
|---|---|---|---|---|
| 4,192,253 A | * | 3/1980 | Aichert et al. ............... | 118/712 |
| 5,681,144 A | * | 10/1997 | Spring et al. ............. | 416/97 R |
| 5,876,860 A | * | 3/1999 | Marijnissen et al. ........ | 428/623 |
| 5,955,202 A | * | 9/1999 | Steeg et al. ................. | 428/457 |
| 5,997,947 A | * | 12/1999 | Burns et al. ................ | 427/240 |
| 6,139,191 A | * | 10/2000 | Andler et al. ............... | 384/276 |

FOREIGN PATENT DOCUMENTS

DE 195 14 835 1/1997

* cited by examiner

Primary Examiner—Shrive P. Beck
Assistant Examiner—William Phillip Fletcher, III
(74) Attorney, Agent, or Firm—Collard & Roe, P.C.

(57) ABSTRACT

The invention relates to a method of producing an antifriction element (6), by means of which a coating is applied to at least one surface (10) of the antifriction element (6) under vacuum, by guiding the antifriction element (6) through a particle flow (4), which at least partially forms the coating, in a rotary motion about an axis perpendicular to the particle flow longitudinal median axis (5) or parallel with a length of a device containing the coating substance (2).

16 Claims, 2 Drawing Sheets

METHOD OF COATING A CONCAVE FRICTION BEARING

BACKGROUND OF THE INVENTION

1. Field of the Invention

The invention relates to a method of producing an antifriction element, in particular a friction bearing half-shell, by means of which at least one coating is applied to at least one surface of the antifriction element, in particular to a surface with a concave curvature, and the antitriction element is displaced through a particle flow at least partially forming the coating.

2. Description of the Prior Art

Methods of applying metallic layers to a metallic base under vacuum have long been known. DE 195 14 835 C1 corresponding to U.S. Pat. No. 5,955,202, for example, discloses a method of applying a coating to concave antifriction elements by vapour-deposition. To this end, a specific distance is set between the base and the surface of the vapour bath. The substance to be deposited is disposed in evaporator pans and evaporation is operated by means of electron radiation. The substrate is guided through the particle flow as it forms so that, as the coating is being vapour-deposited, the evaporator and the base body are displaced at a non-uniform speed relative to one another. The speed of the linear motion reaches its maximum component both as it enters and leaves this beam of vapour. In order to ensure in addition that the thickness of the vapour-deposited coating does not vary by more than 15% from the minimum thickness of the layer, parts of the vapour flow are masked by screens.

The disadvantage of this type of vapour deposition is that the layer thickness is determined by various parameters which have to be reconciled with one another and a relatively complex sequence of motions needs to be programmed and monitored or controlled. In addition, structural components have to be used in order to achieve the desired ratio of coating thicknesses.

SUMMARY OF THE INVENTION

The underlying object of the present invention is to provide a method of the type outlined above which requires no structural components placed in the particle flow needed to produce coatings with a specific coating thickness profile.

This object is achieved by guiding the antifriction elements through the particle flow in rotating motion about an axis perpendicular to a longitudinal median axis of the particle flow or parallel with a length of a device containing the substance to be deposited. The antifaction element is rotated by less than 180° between entering and leaving the particle flow, and one side and the crown of the concave surface of the antifriction element is at least partially masked or screened by the antifriction element itself due to the rotating motion and, secondly, every region of the curved surface of the antifriction element assumes at least more or less the same position relative to the particle flow during the rotation, so that the quantity precipitated onto the sides of the substrate match the quantity in the crown region of the antifriction element, thereby enabling a largely uniform coating thickness to be produced. Accordingly, no additional screens need to be provided at the centre of the particle flow. Another advantage as compared with the known method is that this method enables large-sized bearings to be coated, such as used in motors outside the automotive industry, i.e. with a radius of more than 150 mm.

Yet another advantage is obtained if the rotating motion is combined with a linear motion having a velocity component perpendicular to the longitudinal median axis of the particle flow and/or the velocity component of the linear motion perpendicular to the rotating motion, since the linear motion provides one possible way of coating individual components and their direction of displacement can be adjusted to best suit the coating conditions.

Another advantage is the fact that the linear motion is effected continuously and/or in the same pattern, which reduces the technical complexity of this method accordingly, as compared with the method known from the prior art.

Another advantage is the fact that end faces of the antifriction element are aligned at least approximately parallel with the particle flow longitudinal median axis or particle flow, in particular with a line externally bounding the propagation of the particle flow, since this helps to keep the coating thickness of the deposited coating uniform.

Rotation of the antifriction element by less than 180° between entering the particle flow and leaving the particle flow will produce complete coverage of the concave surface generally used with antifriction elements of this type and enable the rotation of the antifriction elements to be adjusted to suit the specific antifriction element.

Another embodiment also offers advantages, whereby the particle flow is limited by laterally disposed aperture screens between the antifriction element and the device containing the substance to be vapour-deposited and a rotation angle of the rotary motion is adapted to the aperture cross section of the aperture screens and resultant particle flow so that the timing of the rotary motion can be optimised, thereby reducing cycle times and making the process more economical.

A different embodiment is possible, in which the antifriction element is aligned on a rotary element, e.g. a rotating drum, a turntable or similar, whose rotation axis is directed perpendicular to the particle flow longitudinal median axis, the advantage of this being that several antifriction elements can be economically coated during one process step.

Another advantage of this arrangement is that several antifriction elements are disposed individually in separate compartments on the rotary element, thereby preventing individual antifriction elements from being damaged by others.

In another advantageous variant of the method, the compartments are designed so that at least one antifriction element can be inserted or at least one antifriction element removed via a gating system during radiation, thereby enabling a continuous production process to be operated.

In another embodiment, the diameter of the rotary element is adapted to the diameter and/or radius of the antifriction elements with the advantage that antifriction elements of different sizes can be coated.

Also of advantage is another embodiment in which the speed of the rotary motion is set depending on a coating thickness, thereby enabling different coating thicknesses to be produced.

Another advantage is the fact that the speed of the rotary motion can be varied, preferably continuously, during rotation thereby enabling distribution of the coating thickness to be selectively varied within a large range across the surface to be coated.

Another advantage is the fact that a multiple coating can be applied by rotating the rotary element several times, which offers a simple way of producing multiple coatings and/or forming an alloy for the coating to be applied or applying the coating in several steps.

BRIEF DESCRIPTION OF THE DRAWINGS

The invention will now be described in more detail with reference to embodiments illustrated in the drawings, wherein.

DETAILED DESCRIPTION OF PREFERRED EMBODIMENTS

Figure 1:
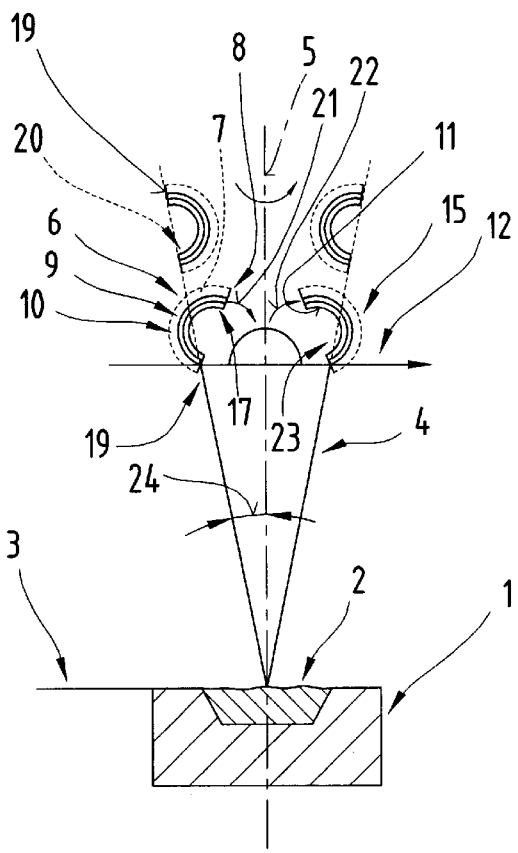
FIG. 1 is a simplified, schematic diagram of the method proposed by the invention.

Firstly, it should be pointed out that the same parts described in the different embodiments are denoted by the same reference numbers and the same component names and the disclosures made throughout the description can be transposed in terms of meaning to same parts bearing the same reference numbers or same component names. Furthermore, the positions chosen for the purposes of the description, such as top, bottom, side, etc,. relate to the drawing specifically being described and can be transposed in terms of meaning to a new position when another position is being described. Individual features or combinations of features from the different embodiments illustrated and described may be construed as independent inventive solutions or solutions proposed by the invention in their own right.

FIG. 1 is a simplified, schematic diagram of the method proposed by the invention. In order to operate the method, a substance 2 to be vaporised, e.g. a metal or an alloy, can be placed in readiness in a pan 1. The substance 2 is preferably evaporated by applying electron beams to it although any other method of evaporation may be used, e.g. heating, laser beams or similar. As a result, a particle flow 4 spreads from the pan 1, i.e. from an evaporator bath surface 3, for example in the form of a beam of vapour, in the direction of a particle flow longitudinal median axis 5 to a workpiece to be coated, e.g. an antifriction element 6. Methods of this type are usually operated under vacuum and the assembly described above must be encased in a closed container (not illustrated in FIG. 1).

In order to restrict the particle flow 4 laterally or limit the diameter of the particle flow 4, a known approach is to provide lateral aperture screens (not illustrated in FIG. 1) and it is also possible to produce such a restriction using only one aperture screen, e.g. an annular diaphragm.

Since the skilled person has long been familiar with the deposition method using an electron beam from the relevant state of the art, it will not be described in any further detail here. The specific point is that the principles relating to the angular dependence of the concentration of particles in the particle flow 4 can best be determined by testing.

The workpieces to be coated, such as the antifriction elements 6, may be in the form of friction bearing half-shells. These friction bearing half-shells may be of a single- or multi-layer structure, in which case one of the layers is provided as a base layer 7 (shown by broken lines in FIG. 1), on top of which the other layers, for example an intermediate layer 8 and/or a diffusion barrier layer 9, are applied. The base layer 7 is usually the outermost layer of the antifriction element 6 relative to the surface 10 with a convex curvature and may be made from steel, for example. A friction coating 11, for example an aluminium-tin alloy, is vapour deposited on top of this single- or multi-layer structure using the method proposed by the invention (in FIG. 1, shown on the right-hand side of the diagram). Clearly, other alloys or metals may also be vapour deposited, such as the alloys commonly processed by the sputter process, aluminium-based alloys containing lead and/or bismuth and/or indium and/or tin as the alloying elements, copper-based and silver-based alloys containing lead and/or bismuth and/or indium and/or tin, copper-lead-, silver-lead-alloys or similar. The list of possible alloys which may be used is not exhaustive and it would also be possible to process alloys and combinations other than those listed here.

Alloys of this type may contain aluminium in the range of between 50% by weight to 90% by weight, for example in the range of between 55% by weight and 80% by weight, preferably in the range of between 60% by weight and 79% by weight, in particular in the range of between 64% by weight and 70% by weight and tin in the range of between 5% by weight and 45% by weight, for example in the range of between 10% by weight and 39% by weight, preferably in the range of between 12% by weight and 32% by weight, in particular in the range of between 17% by weight and 20% by weight. Other alloying elements, e.g. manganese, iron, cobalt or similar may also be incorporated to produce specific alloy phases, e.g. hard materials.

The method or pre-treatment of the base layer 7, for example de-greasing with various solvents and applying the various individual layers, such as the intermediate layer 8 or the diffusion barrier layer 9, e.g. by galvanisation or by plating or rolling processes, or sputtering, are also known from the prior art. In terms of materials, lead-bronze or similar may be used for the intermediate layer 8 or nickel, nickel-chromium, nickel-copper alloys for the diffusion barrier layer 9. Here too, other known alloys may also be used.

However, the antifriction element 6 may be of a structure other than the multi-layered structure described here.

Figure 2:
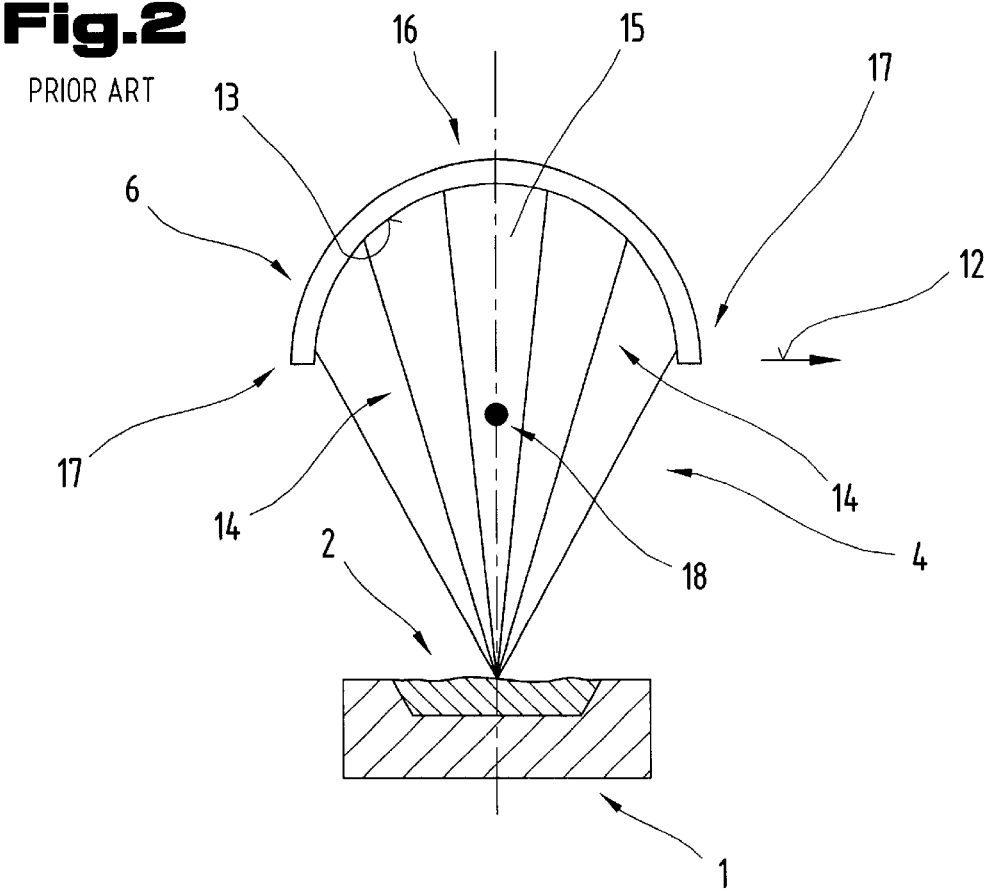
FIG. 2 is a schematic diagram of the method known from the prior art.
Figure 3:
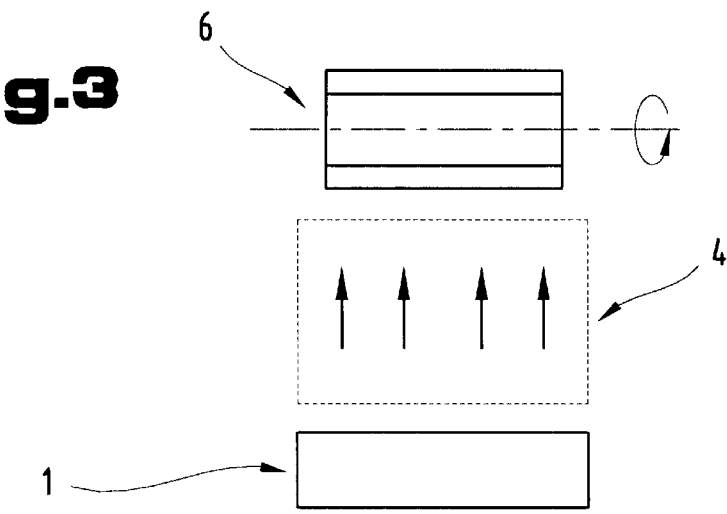
FIG. 3 is a simplified, schematic diagram of the method proposed by the invention with a flat evaporator bath surface.

In order to illustrate the method proposed by the invention and illustrated in FIG. 1, FIG. 2 provides a schematic illustration of a known method, e.g. that mentioned above and known from the German patent specification.

In the method illustrated in FIG. 2, the antifriction element 6 is displaced across the pan 1 in the direction of arrow 12 and the concave surface 13 of the antifriction element to be coated comes into contact with the particle flow 4 during the process. For the sake of simplification, the latter is shown as a dot-shaped vapour source with several segments 14, 15 of the same width, from which the vapour beam spreads in the direction towards the antifriction element 6. From this simplified illustration, it is immediately evident that segments 14 impact with the antifriction element surface 13 at a more acute angle than segment 15. As a result, a larger quantity of the substance 2 to be deposited is applied to a crown region 16 of the antifriction element 6 disposed more or less perpendicular to the evaporator bath surface than to the two side regions 17. In order to produce a more or less uniform coating thickness in spite of this, the German patent specification includes the feature of disposing a heated diaphragm 18 at the centre of the particle flow 4 to mask part of the particle flow 4 and, in addition, the antifriction element 6 is displaced in a non-uniform linear motion, the disadvantage of this system being that it incurs additional manufacturing costs due to the longer coating time and increased energy costs—to mention but a few—and the fact that a more complex sequence of motions has to be set up.

If using the method proposed by the invention illustrated in FIG. 1, an additional diaphragm 18 can be dispensed with. Instead, the antifriction element 6 is displaced in a rotary motion during its linear displacement above the evaporator bath surface 3 in the direction of arrow 12. The linear displacement may be continuous and/or uniform. By preference, prior to entering the particle flow 4, end faces 19 of the antifriction element 6 are disposed so that they are at least more or less parallel with the particle flow longitudinal median axis 5. However, it would also be possible to arrange these end faces 19 more or less parallel with an imaginary extension of an outer periphery 20 of the particle flow 4.

As the antifriction element 6 is displaced through the particle flow 4, the antifriction element 6 additionally completes a rotation in the direction of arrows 21 and 22, with the concave surface 23 of the antifriction element 6 facing the particle flow 4 during vaporisation, so that, on leaving the particle flow 4, end faces 19 lie at least more or less parallel with, at least in the region close thereto, the particle flow longitudinal median axis 5 or periphery 20.

The advantage obtained by incorporating this additional rotating motion is that the particle flow 4 is masked to a certain extent in the region at which the antifriction element 6 enters and leaves it, in particular by the region in the vicinity of the end faces 19. In effect, the particle flow 4 initially only comes into contact with the side region 17. Due to the position of the antifriction element 6 as it enters the particle flow 4 and the geometric design of the antifriction element 6, the particle flow 4 comes into contact with the side region 17 in such a way that the curvature essentially corresponds to that in the crown region 15. As a result, the coating is always applied under at least more or less the same conditions, i.e. every point of the surface 23 of the antifriction element 6 assumes the same relative position to the source during vaporisation, i.e. a position parallel with the evaporator bath surface.

The only exception to this may be the coating at the centre of the particle flow 4, insofar as it is very wide in terms of its dimensions because in this case both the side region 17 and the crown region 15 are coated simultaneously. However, it is possible to get round this problem by selecting a beam angle 24 for the particle flow 4 such that in the centre, i.e. in the crown region 15, only it and not the side region 17 is coated (the large beam angle 24 illustrated in FIG. 1 is used merely for diagrammatic purposes and to clarify the invention and does not represent the real relationships).

Accordingly, from entering the particle flow 4 to leaving it, the antifriction element 6 is rotated by at least more or less 180° (or slightly more) so that on leaving the particle flow 4, the orientation of the antifriction element 6 is a mirror image of its position during the entry phase.

The angle of rotation of the antifriction element 6 may also be slightly less than 180° if the antifriction element 6 is disposed, as illustrated in the top part of FIG 1, in mirror image to the variant described above.

With regard to the orientation of the axes described above, it should be pointed out that, as illustrated in FIG. 3, if the pan 1 is of a longitudinal boat-shaped design, the rotation axis of the antifriction element 6 may also be in parallel alignment with the length of the latter or with the plane through the particle flow 4 illustrated by a broken line in FIG. 3.

Large antifriction elements 6 may also be coated using this method, e.g. with diameters or radii larger than 150 mm.

FIG. 4 illustrates another embodiment of the method proposed by the invention, the particle flow 4 not being illustrated to the correct scale.

In this embodiment, several antifriction elements 6, which may be of the types described above, are preferably arranged on a rotary element 25, for example a rotating drum, a turntable or similar. The entire evaporator system is again encased in a vacuum-sealed container, not illustrated. A rotation axis 26 of the rotary element 25 in this case is perpendicular to the particle flow longitudinal median axis 5 and the rotary element 25 will be rotated in the direction of arrow 27, for example. As a result of the rotating motion of the rotary element 25, the individual antifriction elements 6 to be coated are fed into the particle flow 4 one after the other, producing the same effect as that described with reference to FIG. 1 of masking or coating, including the orientation of the antifriction elements 6 as regards their curvature relative to the particle flow 4. The advantage of using this method illustrated in FIG. 4 is that several antifriction elements 6 can be coated without having to interrupt the coating process.

As shown by the broken lines of FIG. 4, the antifriction elements 6 may be arranged in individual compartments 28 separately from one another. These compartments 28 may. be mounted on the rotary element 25 so that the individual compartments 28 can be taken out of the rotary element 25, for example. As a result, if a gate as shown by reference 29 is provided, being disposed in the direction of the particle flow longitudinal median axis 5 opposite the evaporator bath surface 3 for example—the positioning may naturally also be different—at least one compartment 28 together with the antifriction element 6 disposed therein may be removed from the rotary element 25 by a device 30 (shown by broken lines in FIG. 3) integrated in the gate 29. This enables production to be operated in a continuous process if the gate 29 has a laterally disposed inlet 31 and an outlet 32, for example, so that, during vaporisation, an antifriction element 6 that has already been coated can be moved into the gate 29 and from there moved out of the gate—in the direction of arrow 33—and a new, uncoated antifriction element 6 fed into the gate—in the direction of arrow 34—and then on to the rotary element 25 by means of the device 30.

In order to produce as uniform a coating thickness as possible or a specific profile of coating thickness across the concave surface of the antifriction element 6 with this embodiment, the diameter of the rotary element 25 may be selected according to the radius of the anti-friction element 6, e.g. the radius of the concave surface 23, in order to obtain the correct orientation of the antifriction elements 6 relative to the particle flow 4, i.e. essentially an optimum orientation of the surface with the concave curvature relative to the particle flow 4 as described above. In this connection, it would also be possible to select the diameter of the rotary element 25 so that antifriction elements 6 of differing radii are coated.

The rotary angle of the antifriction elements 6 may also be adapted to suit the beam angle afforded by the aperture screens.

With both variants of the method proposed by the invention, the speed of the rotary motion can be set depending on the desired coating thickness and, for example, a higher speed might be pre-set for the phase during which the antifriction element 6 enters the particle flow 4 than the rotation speed at the centre of the particle flow or alternatively the speed ratios could be reversed. A thicker coating thickness could then be produced by. operating the linear or rotary motion at a slower speed.

In particular, it would be possible to vary the speed of the rotary motion during the rotation.

Clearly, any number of different motion sequences could also be used for the linear displacement of the antifriction element 6.

Figure 4:
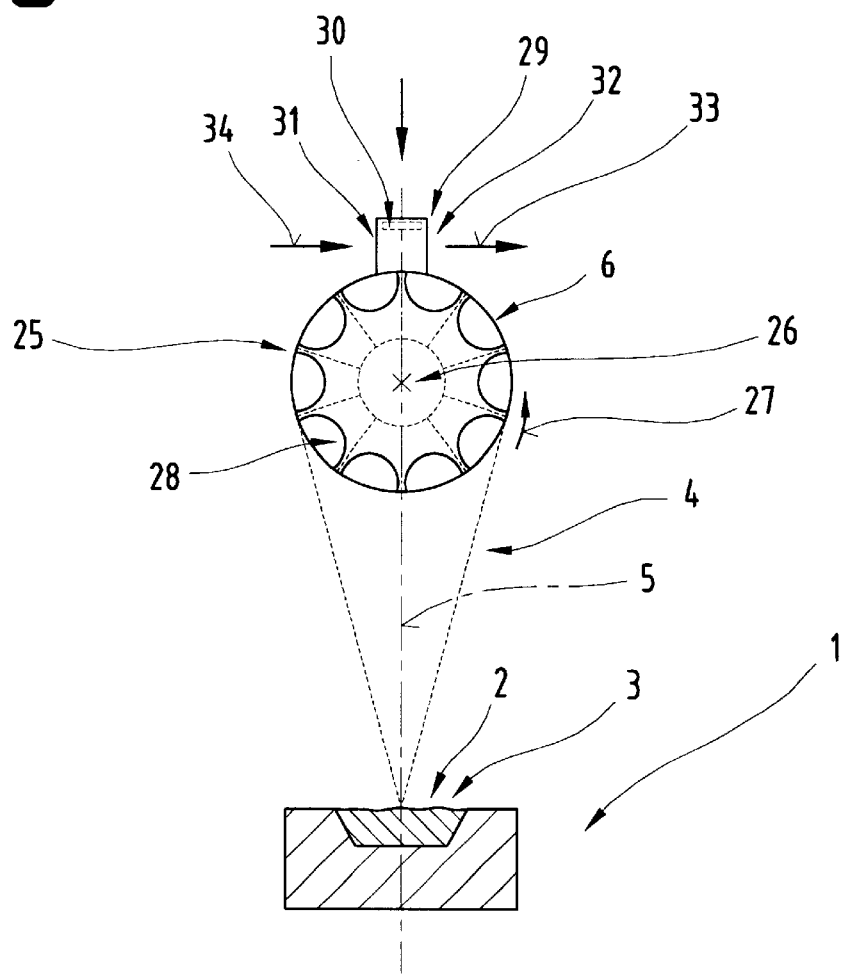
FIG. 4 is a simplified, schematic diagram of another embodiment of the method proposed by the invention.

With both of the variants, in particular the embodiment illustrated in FIG. 4, it would also be possible to apply more than one coating, for example by rotating the rotary element 25 two or more times. This would also offer an advantage in that if two pans 1 were disposed in the container, a first substance 2 could be deposited on the antifriction elements 6 during a first rotation and a second substance 2 on top of the first during a second rotation or alternatively it would also be possible to apply alloys to the antifriction elements 6 during the coating process. It would, of course, also be possible to apply one coating in stages by operating several rotations.

Another advantage is to be had if the distance of the antifriction elements 6 from the evaporator bath surface is in the range of between 30 mm and 250 mm, preferably in the range of between 40 mm and 200 mm, in particular in the range of between 50 mm and 150 mm, in each case plus the radius of the antifriction element 6. The lower limits for this clearance are preferably used for antifriction elements 6 of larger radii.

Finally, it should be pointed out that for the embodiments described above, the point from which the antifriction elements 6 is displaced is above the pan 1. However, it would also be possible for the centre of motion to be underneath the pan 1 or to place the pan 1 at the centre of motion. These variants would have the advantage of allowing large bearings to be coated.

For the sake of good order, it should finally be pointed out that in order to provide a clearer understanding of the device proposed by the invention, it and its constituent parts have been illustrated out of scale to a certain extent and/or on an enlarged and/or reduced scale.

The tasks underlying the independent inventive solutions can be found in the description.

Above all, subject matter relating to the individual embodiments illustrated in FIGS. 1; 2; 3; 4 can be construed as independent solutions proposed by the invention. The tasks and solutions can be found in the detailed descriptions relating to these drawings.

List of Reference Numbers

1. Pan
2. Substance
3. Evaporator bath surface
4. Particle flow
5. Particle flow longitudinal median axis
6. Antifriction element
7. Base layer
8. Intermediate layer
9. Diffusion barrier layer
10. Surface
11. Friction coating
12. Arrow
13. Antifriction element surface
14. Segment
15. Segment
16. Crown region
17. Side region
18. Screen
19. End face
20. Periphery
21. Arrow
22. Arrow
23. Surface
24. Beam angle
25. Rotary element
26. Rotation axis
27. Arrow
28. Compartment
29. Gate
30. Device
31. Inlet
32. Outlet
33. Arrow
34. Arrow

What is claimed is:

1. Method of producing a friction bearing half-shell, which comprises the step of applying a coating under vacuum to at least one surface of the friction bearing having a concave curvature, by displacing the friction bearing through a particle flow which at least partially forms the coating, characterised in that the friction bearing is guided through the particle flow in a rotating motion about an axis perpendicular to a particle flow longitudinal median axis, the friction bearing being rotated by less than 180° between entering and leaving the particle flow, and one side and the crown of the surface being at least partially masked by the friction bearing during rotation.

2. Method according to claim 1, characterised in that the rotary motion is combined with a linear motion having a velocity component perpendicular to the particle flow longitudinal median axis.

3. Method according to claim 2, characericed in that the velocity component of the linear motion is perpendicular to the axis of the rotary motion.

4. Method according to claim 2, characterized in that the linear motion is operated continuously.

5. Method according to claim 2, characterized in that the linear motion is operated at a uniform velocity.

6. Method according to claim 1, characterised in that prior to entering the particle flow, end faces of the friction bearing are in substantially parallel alignment with the particle flow longitudinal median axis or with the particle flow.

7. Method according to claim 1, characterised in that the rotary motion is operated so that the concave surface of the friction bearing is directed towards the particle flow during the rotary motion.

8. Method according to claim 1, characterised in that the friction bearing is disposed on a rotary element, the rotation axis of which is perpendicular to the particle flow longitudinal median axis.

9. Method according to claim 8 characterized in that several friction bearings are placed on the rotary element in separate compartments.

10. Method according to claim 9, characterized in that the compartments are designed so that at least one friction bearing can be fed into them or at least one friction bearing removed from them via a gate during exposure to the beam.

11. Method according to claim 8, characterised in that the diameter of the rotary element is selected according t the diameter of the friction bearings.

12. Method according to claim 8, characterised in that more than one coating is applied by rotating the rotary element more than once.

13. Method according to claim 1, characterised in that the speed of the rotating motion is determined depending on a coating thickness.

14. Method according to claim 1, characterised in that the speed of the rotating motion during the rotation is varied continuously.

15. Method of producing a friction bearing half-shell, which comprises the step of applying a coating under vacuum to at least one surface of the friction bearing having a concave curvature, by displacing the friction bearing through a particle flow which at least partially forms the coating, characterised in that the friction bearing is guided through the particle flow in a rotating motion about an axis parallel with a length of a device containing a substance forming the coating, the friction bearing being rotated by less than 180° between entering and leaving the particle flow, and one side and the crown of the surface being at least partially masked by the friction bearing during rotation.

16. Method according to claim 15, characterised in that the particle flow is bounded by laterally disposed aperture screens between the friction bearings and the device for receiving the substance to be deposited and an angle of rotation of the rotary motion is adapted to the aperture cross section of the aperture screens and the resultant particle flow.

* * * * *